United States Patent

Lim et al.

[11] Patent Number: 5,851,706
[45] Date of Patent: Dec. 22, 1998

[54] PHASE SHIFT MASKS INCLUDING CHROMIUM OXIDE AND ALUMINA PHASE SHIFTER PATTERNS, AND METHODS OF MANUFACTURING AND USING THE SAME

[75] Inventors: Sung-chul Lim; Sang-gyun Woo; Ho-young Kang; Kwang-soo No, all of Kyungki-do, Rep. of Korea

[73] Assignee: Samsung Electronics Co., Ltd., Suwon, Rep. of Korea

[21] Appl. No.: 882,719

[22] Filed: Jun. 25, 1997

[30] Foreign Application Priority Data

Oct. 16, 1996 [KR] Rep. of Korea ............... 1996-46357

[51] Int. Cl.⁶ .................................................. G02F 9/00
[52] U.S. Cl. .................................. 430/5; 428/210
[58] Field of Search .................. 430/5, 322, 324; 428/210

[56] References Cited

U.S. PATENT DOCUMENTS 5,389,474  2/1995  Iguchi et al. ............................... 430/5
5,536,604  7/1996  Ito ............................................. 430/5

*Primary Examiner*—S. Rosasco
*Attorney, Agent, or Firm*—Myers Bigel Sibley & Sajovec

[57] ABSTRACT

A half tone phase shift mask includes a substrate which is transparent with respect to exposure radiation and a phase shifter pattern on the substrate. The phase shifter pattern comprises chromium oxide ($Cr_2O_3$) and alumina ($Al_2O_3$). Fine patterns can therefore be formed using phase shift masking of exposure radiation having a 193 nm wavelength, such as light from an ArF excimer laser.

33 Claims, 5 Drawing Sheets

PHASE SHIFT MASKS INCLUDING CHROMIUM OXIDE AND ALUMINA PHASE SHIFTER PATTERNS, AND METHODS OF MANUFACTURING AND USING THE SAME

FIELD OF THE INVENTION

This invention relates to integrated circuit manufacturing, and more particularly to phase shift masks for integrated circuits and manufacturing methods therefor.

BACKGROUND OF THE INVENTION

As integration densities of integrated circuit devices continue to increase, it may become increasingly difficult to fabricate fine linewidths using conventional photomasks. Accordingly, phase shift masks have been studied as an alternative for increasing integration density.

A phase shift mask includes a phase shifter, in contrast with a conventional photo mask. The principle used to form a pattern with the phase shift mask is that radiation passing through a portion of the mask having a phase shifter and through a portion of the mask which does not have a phase shifter has a phase difference of 180°, thus causing interference patterns.

This principle will now be briefly described. Assuming that radiation, such as light, traveling in a vacuum, is transmitted through a phase shifter, the wavelength $\lambda$ of light passing through the phase shifter can be expressed as $\lambda_0/n$. Here, $\lambda_0$ indicates the wavelength of the light traveling in vacuum, and n indicates the refractive index of the phase shifter. Therefore, the wavelength becomes shorter upon passing through the phase shifter. Thus, the wavelength of light passing through the portion having a phase shifter is different from that passing through the portion which does not have a phase shifter. The phase difference can be described as:

$$\delta = 2\pi t(n-1)/\lambda_0 \quad (1)$$

where $\delta$ is the phase difference, t is the thickness of the phase shifter, n is the refractive index of the phase shifter, and $\lambda_0$ is the wavelength of light traveling in vacuum. Hence, the phase difference of light passing through the phase shifter portion and through the portion having no phase shifter varies with the thickness, refractive index of the phase shifter and the wavelength of the light.

Much research into a half tone shift mask has been conducted, since its manufacturing process can be relatively easy, and it can be efficiently used to form highly dense repeated line-space patterns, and very small contact holes. Half tone shift masks generally use a phase shift material, which is transparent enough to show a 1–30% transmissivity with respect to exposure light in an I-line region (wavelength: 365 nm) and a deep ultraviolet (UV) region (wavelength: 248 nm) and which can shift a phase to 180°.

The reason why the phase shift material should have semitransparency with respect to the exposure light is to prevent light passing through the phase shift material from having enough intensity to expose a photoresist film. Thus, the major phase shift materials generally used are MoSiON, MOSiO, and Cr oxides.

In general, if the energy band gap Eg of a phase shift material is much larger than the energy of the exposure light, most of the light is transmitted through the phase shift material. On the other hand, if the energy of the exposure light is not smaller than the energy band gap Eg of the phase shift material, most of the light is absorbed by the phase shift material. Accordingly, as the wavelength of the exposure light decreases, the transmissivity of the exposure light with respect to the phase shift material decreases.

A phase shift mask to which a conventional phase shift mask material is applied generally cannot be used in exposure equipment which uses a 193 nm wavelength ArF excimer laser which has recently been developed to obtain dense integration of semiconductor devices. This is because conventional phase shift materials such as MoSiON, MOSiO, and Cr oxides are opaque to light of 193 nm.

In conclusion, it may be difficult to form fine photoresist film patterns using phase shift masks in exposure equipment using a 193 nm wavelength ArF excimer laser. Therefore, there is an increasing need for a phase shift material which is semitransparent even under a 193 nm wavelength ArF excimer laser.

SUMMARY OF THE INVENTION

It is therefore an object of the present invention to provide improved phase shift masks, and methods of manufacturing and using the same.

It is another object of the present invention to provide phase shift masks which can be semitransparent with respect to exposure from a 193 nm wavelength ArF excimer laser, and methods of manufacturing and using the same.

These and other objects are provided according to the present invention by a phase shift mask which includes a phase shifter comprising chromium oxide ($Cr_2O_3$) and alumina ($Al_2O_3$). The phase shifter comprising chromium oxide and alumina can be semitransparent with respect to exposure radiation such as light from a 193 nm wavelength ArF excimer laser, so that fine patterns may be formed on an integrated circuit using phase shift masks of the present invention.

In particular, phase shift masks of the present invention include a substrate and a phase shifter pattern on the substrate. The substrate is transparent with respect to the exposure radiation. The phase shifter pattern exposes a predetermined area of the substrate and comprises chromium oxide and alumina. The phase shifter pattern preferably comprises a mixture or a solid solution of chromium oxide and alumina.

Phase shift masks according to invention also preferably include radiation blocking film patterns on a predetermined area of the phase shifter pattern. The radiation blocking film pattern preferably selected from the group consisting of Cr, Al and MoSi.

The phase shifter pattern comprising chromium oxide and alumina preferably has a transmissivity of 1–30% with respect to the exposure radiation. The phase shifter pattern also preferably produces a phase difference of 90°–270° between first radiation transmitted through the phase shifter pattern and second radiation transmitted through an exposed substrate area. More preferably, the phase shifter pattern shifts the phase of the exposure radiation by 180°.

An etch stopper may also be included in phase shift masks according to the invention, between the substrate and the phase shifter pattern. The etch stopper may be formed of indium tin oxide.

Phase shift masks may be manufactured according to the present invention by forming a phase shifter pattern comprising chromium oxide and alumina on a substrate which is transparent to exposure radiation, the phase shifter pattern exposing a predetermined area of the substrate. The phase shifter pattern is preferably formed by sputtering the phase shifter comprising chromium oxide and alumina on the substrate, and then patterning the phase shifter until a predetermined area of the substrate is exposed. Sputtering is preferably accomplished by using a hybrid target which is obtained by mechanically mixing chrome and aluminum, a multimetal target separated into chrome and aluminum, a solid solution target comprising a solid solution of chrome and aluminum or a solid solution of chromium oxide and alumina.

Prior to sputtering the phase shifter, an etch stopper may be formed on the substrate. Then, during patterning, the phase shifter is patterned to expose a predetermined area of the etch stopper.

In a particular method of fabricating phase shift masks according to the present invention, a phase shifter comprising chromium oxide and alumina is sputtered on a substrate which is transparent to exposure radiation. A material layer is formed on the phase shifter. The material layer and phase shifter are patterned until a predetermined area of the substrate is exposed, to thereby form a radiation blocking film and a phase shifter pattern. A predetermined portion of the radiation blocking film on the phase shift pattern is removed until a predetermined area of the phase shifter pattern is exposed, to thereby form a radiation blocking film pattern. The patterning step may comprise the step of sequentially and anisotropically etching the material layer and the phase shifter using the same source gas or a different source gas.

Phase shift masks according to the invention may be used to fabricate an integrated circuit. The integrated circuit is exposed to patterned exposure radiation by passing the exposure radiation through a phase shift mask which includes a substrate which is transparent with respect to the exposure radiation and a phase shift pattern on the substrate, the phase shift pattern comprising chromium oxide and alumina. The phase shift pattern preferably has a transmissivity of 1–30% with respect to the exposure radiation.

Accordingly, fine patterns may be formed for integrated circuits using phase shifter patterns of chromium oxide and alumina. The phase shifter patterns may be used relative to exposure radiation having a 193 nm wavelength such as those provided by an ArF excimer laser, to thereby produce high quality, highly integrated circuits.

DETAILED DESCRIPTION OF PREFERRED EMBODIMENTS

Figure 1:
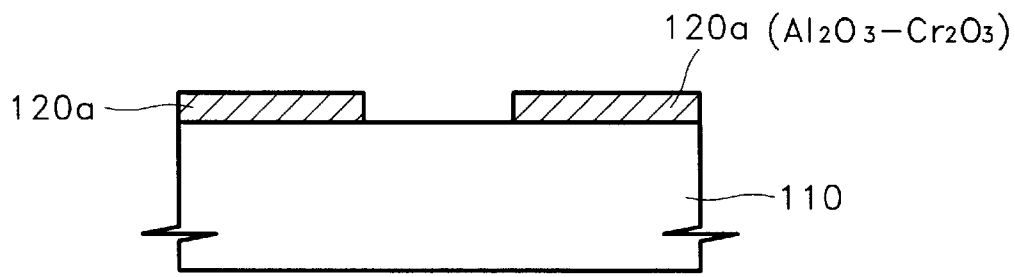
FIGS. 1–6 are views for explaining phase shift masks of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

FIG. 1 is a cross-sectional view of phase shift masks of the present invention. Reference numeral 11 denotes a substrate which is formed of a material which is transparent with respect to exposure radiation such as light, for example quartz. Reference numeral 120a denotes phase shifter patterns formed on the substrate 110 for exposing a predetermined area of the substrate.

The phase shifter patterns 120a are formed of a mixture or solid solution of chromium oxide ($Cr_2O_3$) and alumina ($Al_2O_3$). In addition, the phase shifter patterns 120a have a transmissivity of 1–30% with respect to the exposure light. Light passing through the area where the phase shifter patterns 120a are formed and the exposed substrate area has a phase difference of 90°–270°, preferably 180°.

Figure 2:
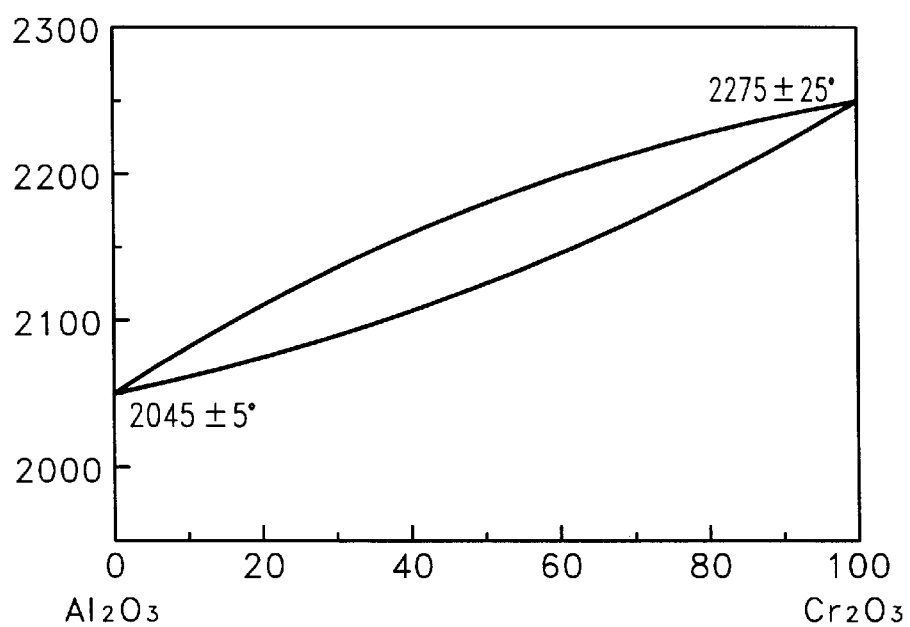

FIG. 2 is a state diagram of chromium oxide and alumina. The chromium oxide and alumina can form a complete solid solution. That is, since they have α phase at every composition regardless of composition variation, a uniform film can be obtained regardless of the composition variation. Therefore, the transmissivity and phase difference can be adjusted by controlling the composition ratio of the chromium oxide and alumina.

As the amount of alumina increases, the transmissivity of the exposure light increases because with respect to the exposure light, the chromium oxide is opaque while the alumina is transparent. In addition, with respect to a 193 nm wavelength exposure light, the refractive index of the chromium oxide is 2.3 while the refractive index of the alumina is 1.8. Thus, as the amount of chromium oxide increases, the refractive index of the solid solution increases, thereby increasing the phase difference as shown by Equation 1.

Figure 3:
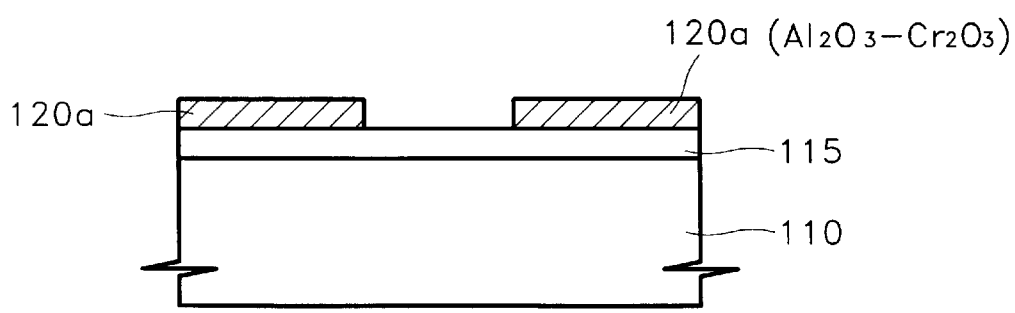

FIG. 3 is a cross-sectional view of phase shift masks including an etching barrier. Reference numeral 115 denotes the etching barrier (also referred to as an etch stopper) formed on the surface of the substrate 110 between the substrate 110 and the phase shifter patterns 120a.

The etching barrier 115 protects the substrate 110 during formation of the phase shifter patterns 120a. Therefore, the etching barrier 115 preferably has a large etching selectivity with respect to the phase shifter patterns 120a. This is because light transmitted through an area of the etching barrier 115 exposed by the phase shifter patterns 120a should have enough intensity to expose a photoresist film. Hence, the etch stopper 115 is preferably formed of indium tin oxide (ITO).

Figure 4:
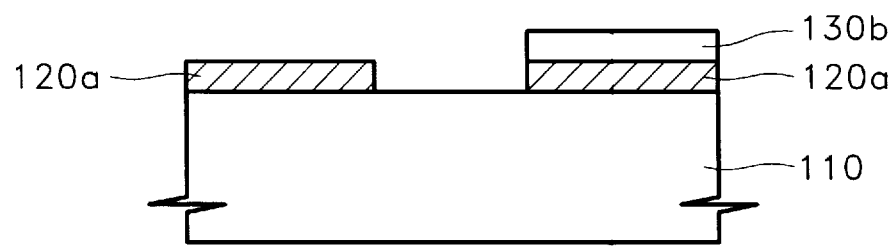

FIG. 4 is a cross-sectional view of phase shift masks further including a light blocking film on a predetermined area. Reference numeral 130b denotes a light blocking pattern formed on a predetermined area of the phase shifter patterns 120a. To enable the area where the light blocking pattern 130b is formed to block exposure light, the light blocking pattern 130b preferably is selected from Cr, Al, and MoSi.

The light blocking pattern 130b need not be completely opaque, since even though a small amount of the exposure light is transmitted through the light blocking pattern 130b, only a small amount of the transmitted light passes through the phase shifter patterns 120a. Therefore, the transmissivity of the area having the light blocking pattern 130b is much lower than that of the area having the phase shifter patterns 120a.

Figure 5:
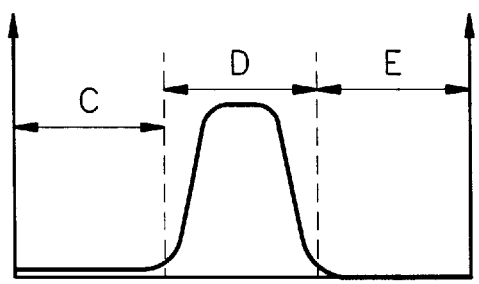

FIG. 5 is a graph of the intensity of light transmitted through the phase shift mask of FIG. 4. Reference character C denotes an area having only the phase shifter patterns 120a. Reference character D denotes a substrate area exposed by the phase shifter patterns 120a, and reference character E denotes an area where the light blocking pattern 130b is formed on the phase shifter patterns 120a.

Light transmitted through the exposed substrate area D has enough intensity to expose a photoresist film, whereas light transmitted through area C does not have enough intensity to expose the photoresist film due to its transmissivity of 1–30%. In addition, the photoresist film is not exposed in area E having the light blocking pattern 130b because area E is opaque with respect to the exposure light.

Light is transmitted through area C having only the phase shifter patterns 120a with a small transmissivity. Therefore, if the photoresist film corresponding to this area has steps, light is diffusely reflected in this area and focused on a predetermined portion of the photoresist film. As a result, the focused area may be exposed unintentionally.

Furthermore, when patterns are repeatedly formed by displacing the phase shift mask relative to a wafer, the photoresist film portion corresponding to an edge of the phase shift mask may be overlapped. Hence, even though a phase shift pattern is formed on the edge of the phase shift mask, light transmitted through the edge is projected onto the photoresist film, which may result exposure of the photoresist film which should not be exposed. Accordingly, the light blocking pattern 130b is used to form an area opaque with respect to the exposure light.

Figure 6:
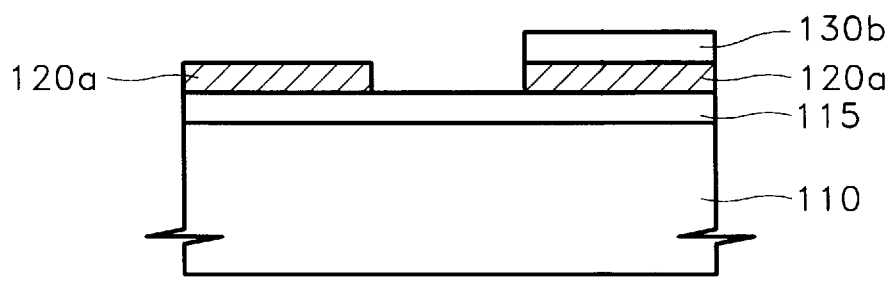

FIG. 6 is a cross-sectional view of phase shift masks of FIG. 4 further including an etching barrier. Reference numeral 115 denotes an etching barrier between the substrate 110 and the phase shifter patterns 120a. The etching barrier 115 protects the substrate 110 during formation of the phase shifter patterns 120a. It is preferable to form the etching barrier 115 of ITO, for the reasons described with reference to FIG. 3.

Preferred embodiments for manufacturing the phase shift masks of the present invention will now be described in detail. FIGS. 7–10 are cross-sectional views illustrating an embodiment of a phase shift mask manufacturing methods of the present invention.

Figure 7:
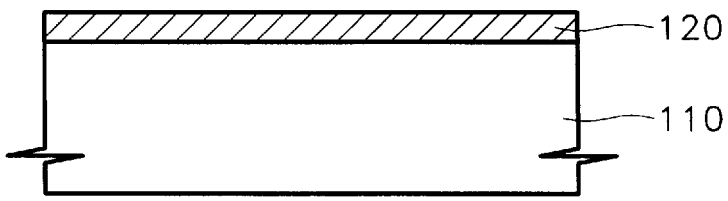
FIGS. 7–10 are cross-sectional views illustrating an embodiment of phase shift mask manufacturing methods of the present invention.

FIG. 7 illustrates the step of forming the substrate 110 and a phase shifter 120. The phase shifter 120 is formed of a mixture or solid solution of chromium oxide and alumina by sputtering.

During sputtering, a target to be used is selected from a mixture target obtained by mechanically mixing the chromium oxide and alumina, a multi-metal target separated into chrome (Cr) and aluminum (Al), and a solid solution target consisting of solid solutions of chrome and alumina or chromium oxide and alumina. With the mixture target or the multi-metal target, the sputtering preferably is performed in an oxygen atmosphere.

Figure 8:
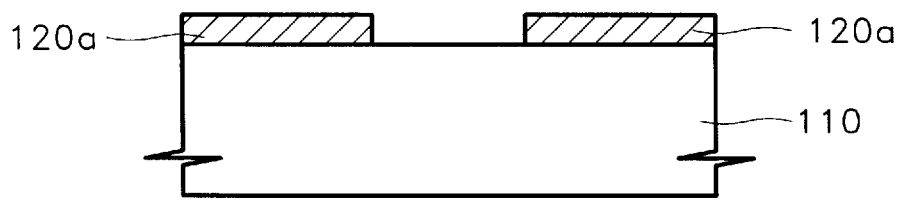

FIG. 8 illustrates the step of forming the phase shifter patterns 120a. The phase shifter patterns 120a are formed by patterning the phase shifter 120 until a predetermined area of the substrate 110 is exposed.

Figure 9:
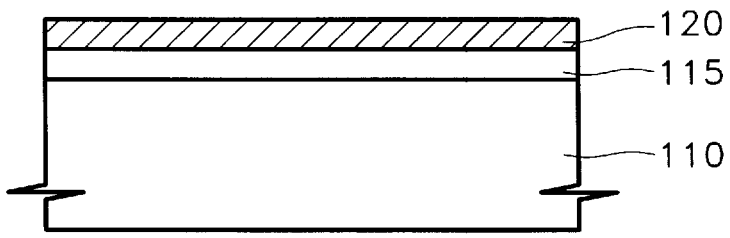
Figure 10:
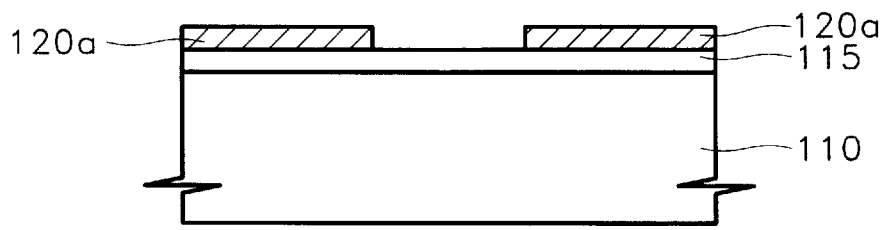

FIGS. 9 and 10 illustrate methods for manufacturing the phase shift masks of FIG. 3. FIG. 9 illustrates the step of forming the substrate 110, the etching barrier 115, and the phase shifter 120. The etching barrier 115 is formed of, for example, ITO, on the substrate 110 which is transparent with respect to exposure light. Subsequently, the phase shifter 120 is formed on the etching barrier 115 in the same manner as that of FIG. 7.

FIG. 10 illustrates the step of forming the phase shifter patterns 120a. The phase shifter patterns 120a are formed by patterning the phase shifter 120 until a predetermined area of the etching barrier 115 is exposed.

The etching barrier 115 protects the substrate 110 against damage when patterning the phase shifter 120. If the substrate 110 is damaged, the phase difference of transmitted light may vary due to the damaged portion. The etching barrier 115 may prevent this damage.

FIGS. 11–18 are cross-sectional views illustrating another embodiment of phase shift mask manufacturing methods of the present invention. In particular, FIGS. 11–14 are cross-sectional views illustrating methods for manufacturing the phase shift mask shown in FIG. 4.

Figure 11:
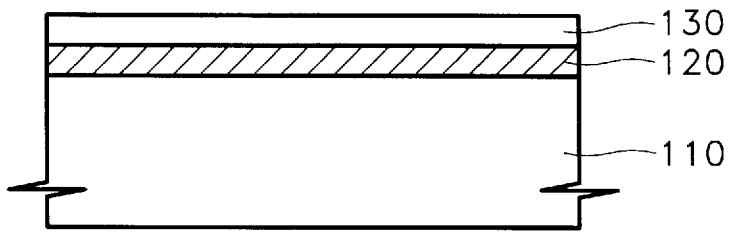
FIGS. 11–18 are cross-sectional views illustrating another embodiment of phase shift mask manufacturing methods of the present invention.

FIG. 11 illustrates the step of forming the phase shifter 120 and a material layer 130. The phase shifter 120 is formed on the substrate 110 which is transparent with respect to the exposure light in the same manner as that of FIG. 7. Then, the material layer 130 is formed of material selected from Cr, Al, and MoSi, to have a transmissivity of 1–30% with respect to the exposure light.

Figure 12:
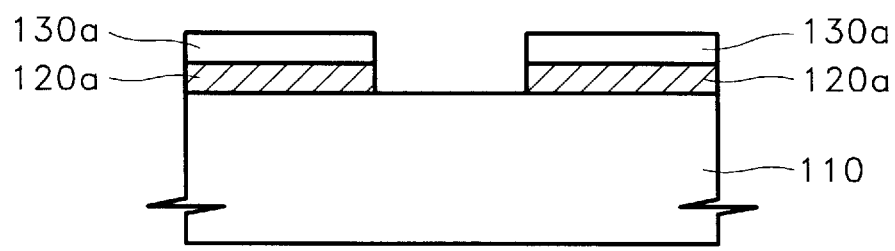

FIG. 12 illustrates the step of forming the light blocking film 130a and the phase shifter patterns 120a. The light blocking film 130a and the phase shifter patterns 120a are formed by patterning the phase shifter 120 until a predetermined area of the substrate 120 is exposed.

When the material layer 130 is formed of Cr or Al, components of the material layer 130 are similar to those of the phase shifter 120. Hence, the material layer 130 and the phase shifter 120 can be anisotropically etched to form the light blocking film 130a and the phase shifter patterns 120a, using the same source gas without replacing an etching gas for the material layer 130, thereby simplifying processing. Alternatively, another source gas can be used regardless of the components of the material layer 130.

Figure 13:
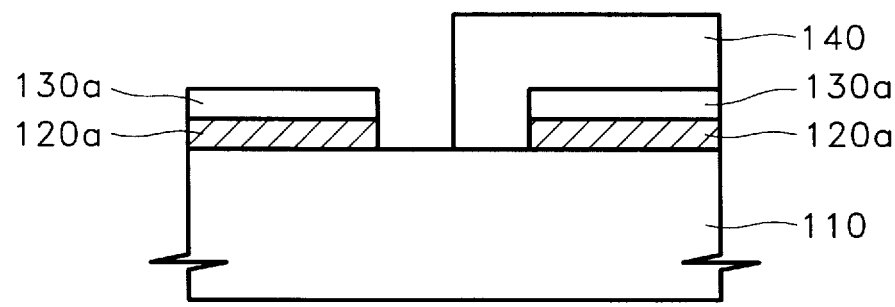

FIG. 13 illustrates the step of forming a photoresist film pattern. A photoresist film is formed on the surface of the substrate having the light blocking film 130a and the phase shifter patterns 120a. Then, the photoresist film pattern 140 is formed by patterning the photoresist film until a predetermined area of the light blocking film 130a is exposed.

Figure 14:
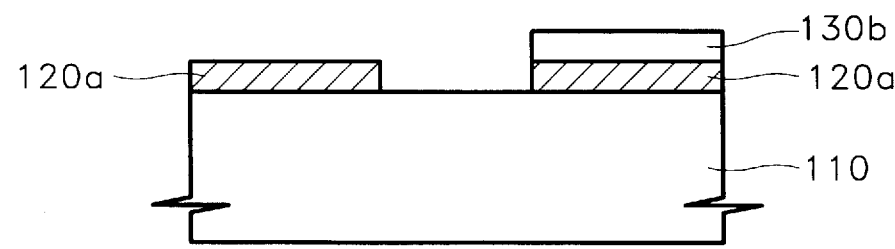

FIG. 14 illustrates the step of forming the light blocking film pattern 130b. The light blocking film pattern 130b is formed by anisotropically etching the light blocking film 130a using the photoresist film pattern 140 as an etching mask.

Figure 15:
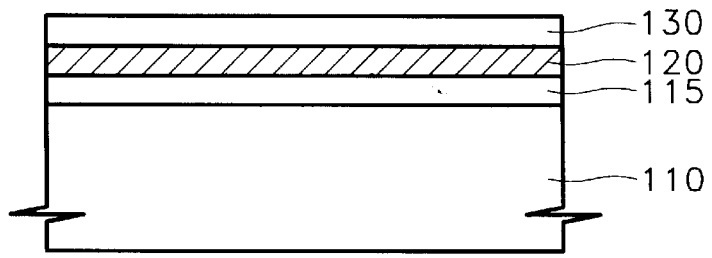

FIGS. 15–18 are cross-sectional views illustrating methods for manufacturing the phase shift masks of FIG. 6. FIG. 15 illustrates the step of forming the etching barrier 115, the phase shifter 120, and the material layer 130. The etching barrier 115 is formed of, for example, ITO on the substrate 110 which is transparent with respect to the exposure light. Then, the phase shifter 120 and the material layer 130 are sequentially formed on the etching barrier 115 in the same manner as that of FIG. 11.

Figure 16:
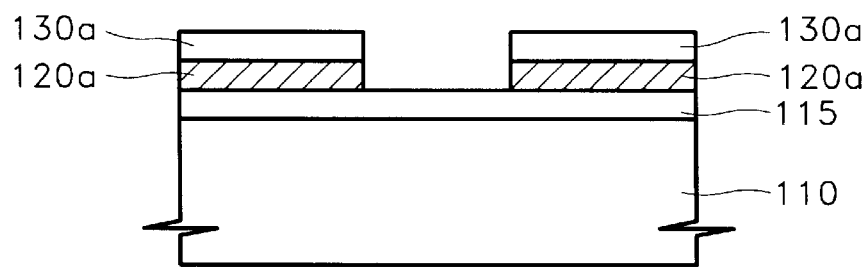

FIG. 16 illustrates the step of forming the light blocking film 130a and the phase shifter patterns 120a. The light blocking film 130a and the phase shifter patterns 120a are formed by patterning the material layer 130 and the phase shifter 120 until a predetermined area of the etching barrier 115 is exposed.

The light blocking film 130a and the phase shifter patterns 120a can be formed by anisotropically etching the material layer 130 and the phase shifter 120 using the same source gas or different source gases as described with reference to FIG. 12.

Figure 17:
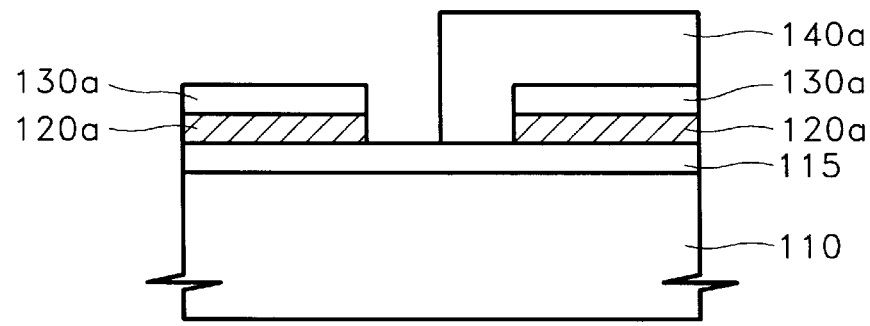

FIG. 17 illustrates the step of forming the photoresist film pattern 140a. First, a photoresist film is formed on the surface of the substrate having the light blocking film 130a and the phase shifter patterns 120a formed thereon. Then, the photoresist film pattern 140a is formed by patterning the photoresist film until a predetermined area of the light blocking film 130a is exposed.

Figure 18:
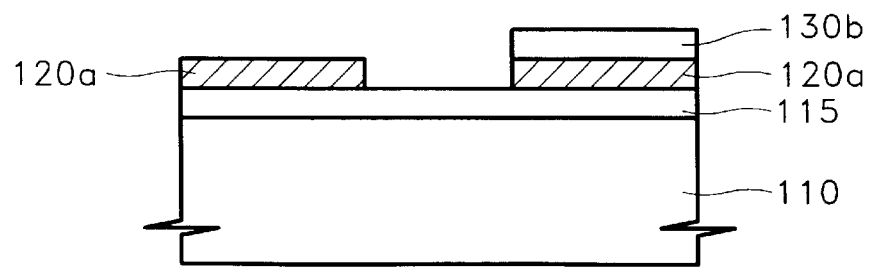

FIG. 18 illustrates the step of forming the light blocking film pattern 130b. The light blocking film pattern 130b is formed by anisotropically etching the light blocking film 140a using the photoresist film pattern 140 as an etching mask. Accordingly, fine patterns can be formed by phase shifting with respect to exposure light having the 193 nm-wavelength of an ArF excimer laser by forming the phase shifter patterns of a mixture or solid solution of the chromium oxide and the alumina.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A phase shift mask comprising:
   a substrate which is transparent with respect to exposure radiation; and
   a phase shifter pattern on the substrate, which exposes a predetermined area of the substrate, the phase shifter pattern comprising a mixture or a solid solution of chromium oxide ($Cr_2O_3$) and alumina ($Al_2O_3$) that form a uniform phase shifter pattern, the transmissivity and phase difference of which are controlled by the ratio of the chromium oxide and alumina; and
   a radiation blocking film pattern on a predetermined portion of the phase shifter pattern opposite the substrate.

2. The phase shift mask of claim 1, wherein the phase shifter pattern has a transmissivity of 1–30% with respect to the exposure radiation.

3. The phase shift mask of claim 2, wherein the phase shifter pattern produces a phase difference of 90°–270° between first radiation transmitted through the phase shifter pattern and second radiation transmitted through an exposed substrate area.

4. The phase shift mask of claim 3, wherein the phase shifter pattern shifts the phase of the exposure radiation by 180°.

5. The phase shifter mask of claim 1, further comprising an etch stopper between the substrate and the phase shifter pattern.

6. The phase shift mask of claim 5, wherein the etch stopper is formed of indium tin oxide (ITO).

7. A phase shift mask manufacturing method comprising the steps of:
   forming a uniform phase shifter pattern comprising a mixture or a solid solution of chromium oxide ($Cr_2O_3$) and alumina ($Al_2O_3$) on a substrate which is transparent to exposure radiation, the phase shifter pattern exposing a predetermined area of the substrate, the transmissivity and phase difference of which are controlled by the ratio of the chromium oxide and the alumina; and
   forming a radiation blocking film pattern on a predetermined portion of the phase shifter pattern, opposite the substrate.

8. The method of claim 7 wherein the forming step comprises the steps of:
   sputtering a phase shifter comprising chromium oxide and alumina on a substrate which is transparent with respect to exposure radiation; and
   patterning the phase shifter until a predetermined area of the substrate is exposed.

9. The method of claim 8, wherein the sputtering step comprises the step of sputtering a phase shifter using a target selected from a hybrid target obtained by mechanically mixing chrome and aluminum, a multi-metal target separated into chrome and aluminum, and a solid solution target comprising a solid solution of chrome and aluminum, and a solid solution of chromium oxide and alumina.

10. The method of claim 8, wherein the sputtering step is preceded by the step of forming an etch stopper on the substrate, and wherein the patterning step comprises the step of patterning the phase shifter to expose a predetermined area of the etch stopper.

11. A phase shift mask manufacturing method comprising the steps of:
    sputtering a uniform phase shifter comprising a mixture or a solid solution of chromium oxide and alumina on a substrate which is transparent to exposure radiation;
    forming a material layer on the phase shifter;
    patterning the material layer and the phase shifter until a predetermined area of the substrate is exposed to thereby form a radiation blocking film and a phase shifter pattern, the transmissivity and phase difference of which are controlled by the ratio of the chromium oxide and the alumina; and
    removing a predetermined portion of the radiation blocking film on the phase shifter pattern until a predetermined portion of the phase shifter pattern is exposed, to thereby form a radiation blocking film pattern.

12. The method of claim 11, wherein the sputtering step is preceded by the step of forming an etch stopper on the substrate, and wherein the patterning step comprises the step of patterning the phase shifter to expose a predetermined area of the etch stopper.

13. The method of claim 11, wherein the patterning step comprises the step of sequentially and anisotropically etching the material layer and the phase shifter using the same source gas.

14. The method of claim 11, wherein the removing step comprises the steps of:
    patterning a photoresist film on the radiation blocking film until a predetermined area of the radiation blocking film is exposed; and
    removing the radiation blocking film using the photoresist film as an etch mask.

15. A method of fabricating an integrated circuit comprising the step of:
    exposing an integrated circuit to patterned exposure radiation by passing the exposure radiation through a phase shift mask which includes a substrate which is transparent to the exposure radiation and a phase shift pattern on the substrate, the phase shifter pattern comprising a mixture or a solid solution of chromium oxide ($Cr_2O_3$) and alumina ($Al_2O_3$) that form a uniform phase shifter pattern, the transmissivity and phase difference of which are controlled by the ratio of the chromium oxide and alumina; and a radiation blocking film pattern on a predetermined portion of the phase shifter patter opposite the substrate.

16. A method according to claim 15, wherein the phase shifter pattern has a transmissivity of 1–30% with respect to the exposure radiation.

17. A phase shift mask for use with exposure radiation having a wavelength of 193 nm or less comprising:
   a substrate which is transparent with respect to exposure radiation having a wavelength of 193 nm or less; and
   a phase shifter pattern on the substrate, which exposes a predetermined area of the substrate, the phase shifter pattern comprising chromium oxide ($Cr_2O_3$) and alumina ($Al_2O_3$).

18. The phase shift mask of claim 17, further comprising a radiation blocking film pattern on a predetermined area of the phase shifter pattern.

19. The phase shift mask of claim 17, wherein the phase shifter pattern has a transmissivity of 1–30% with respect to the exposure radiation having a wavelength of 193 nm or less.

20. The phase shift mask of claim 19, wherein the phase shifter pattern produces a phase difference of 90°–270° between first radiation having a wavelength of 193 nm or less transmitted through the phase shifter pattern and second radiation having a wavelength of 193 nm or less transmitted through an exposed substrate area.

21. The phase shift mask of claim 20, wherein the phase shifter pattern shifts the phase of the exposure radiation having a wavelength of 193 nm or less by 180°.

22. The phase shifter mask of claim 17, further comprising an etch stopper between the substrate and the phase shifter pattern.

23. The phase shift mask of claim 22, wherein the etch stopper is formed of indium tin oxide (ITO).

24. A manufacturing method for a phase shift mask for use with exposure radiation having a wavelength of 193 nm or less, comprising the step of:
   forming a phase shifter pattern comprising chromium oxide ($CrO_2$) and alumina ($Al_2O_3$) on a substrate which is transparent to exposure radiation having a wavelength of 193 nm or less, the phase shifter pattern exposing a predetermined area of the substrate.

25. The method of claim 24 wherein the forming step comprises the steps of:
   sputtering a phase shifter comprising chromium oxide and alumina on a substrate which is transparent with respect to exposure radiation; and
   patterning the phase shifter until a predetermined area of the substrate is exposed.

26. The method of claim 25, wherein the sputtering step comprises the step of sputtering a phase shifter using a target selected from a hybrid target obtained by mechanically mixing chrome and aluminum, a multi-metal target separated into chrome and aluminum, and a solid solution target comprising a solid solution of chrome and aluminum, and a solid solution of chromium oxide and alumina.

27. The method of claim 25, wherein the sputtering step is preceded by the step of forming an etch stopper on the substrate, and wherein the patterning step comprises the step of patterning the phase shifter to expose a predetermined area of the etch stopper.

28. A manufacturing method for a phase shift mask for use with exposure radiation having a wavelength of 193 nm or less, comprising the steps of:
   sputtering a phase shifter comprising chromium oxide and alumina on a substrate which is transparent to exposure radiation having a wavelength of 193 nm or less;
   forming a material layer on the phase shifter;
   patterning the material layer and the phase shifter until a predetermined area of the substrate is exposed to thereby form a radiation blocking film and a phase shifter pattern; and
   removing a predetermined portion of the radiation blocking film on the phase shifter pattern until a predetermined portion of the phase shifter pattern is exposed, to thereby form a radiation blocking film pattern.

29. The method of claim 28, wherein the sputtering step is preceded by the step of forming an etch stopper on the substrate, and wherein the patterning step comprises the step of patterning the phase shifter to expose a predetermined area of the etch stopper.

30. The method of claim 28, wherein the patterning step comprises the step of sequentially and anisotropically etching the material layer and the phase shifter using the same source gas.

31. The method of claim 28, wherein the removing step comprises the steps of:
   patterning a photoresist film on the radiation blocking film until a predetermined area of the radiation blocking film is exposed; and
   removing the radiation blocking film using the photoresist film as an etch mask.

32. A method of fabricating an integrated circuit comprising the step of:
   exposing an integrated circuit to patterned exposure radiation having a wavelength of 193 nm or less, by passing the exposure radiation through a phase shift mask which includes a substrate which is transparent to the exposure radiation having wavelength of 193 nm or less, and a phase shift pattern on the substrate, the phase shifter pattern comprising chromium oxide ($Cr_2O_3$) and alumina ($Al_2O_3$).

33. A method according to claim 32 wherein the phase shifter pattern has a transmissivity of 1–30% with respect to the exposure radiation.

* * * * *